US008653436B2

(12) United States Patent
Ihara (10) Patent No.: US 8,653,436 B2
(45) Date of Patent: Feb. 18, 2014

(54) CMOS PIXEL INCLUDING A TRANSFER GATE OVERLAPPING THE PHOTOSENSITIVE REGION

(75) Inventor: Hisanori Ihara, Hiroshima (JP)

(73) Assignee: OmniVision Technologies, Inc., Santa Clara, CA (US)

( * ) Notice: Subject to any disclaimer, the term of this patent is extended or adjusted under 35 U.S.C. 154(b) by 725 days.

(21) Appl. No.: 12/641,133

(22) Filed: Dec. 17, 2009

(65) Prior Publication Data

US 2010/0176276 A1    Jul. 15, 2010

Related U.S. Application Data

(60) Provisional application No. 61/143,721, filed on Jan. 9, 2009.

(51) Int. Cl.
*H01L 31/00* (2006.01)

(52) U.S. Cl.
USPC ............. 250/214.1; 250/208.2; 257/431; 257/458; 348/272; 348/274; 348/294; 348/308

(58) Field of Classification Search
USPC ...... 250/208.1, 214.1, 214 R, 214 DC, 208.2; 257/431, 432, 458, 461, 462; 348/272, 348/281, 282, 294, 302, 303, 307, 308, 274
See application file for complete search history.

(56) References Cited

U.S. PATENT DOCUMENTS

| | | | |
|---|---|---|---|
| 6,593,607 B1* | 7/2003 | Hseih | 257/292 |
| 2004/0251509 A1* | 12/2004 | Choi | 257/432 |
| 2006/0081887 A1 | 4/2006 | Lyu | |
| 2006/0097296 A1 | 5/2006 | Nam | |
| 2006/0145215 A1 | 7/2006 | Paik et al. | |
| 2007/0029463 A1 | 2/2007 | Park et al. | |
| 2007/0075337 A1* | 4/2007 | Jung et al. | 257/215 |
| 2007/0102739 A1 | 5/2007 | Chen et al. | |

FOREIGN PATENT DOCUMENTS

| | | |
|---|---|---|
| EP | 2 065 938 A2 | 6/2009 |
| JP | 2005-129965 A | 5/2005 |
| KR | 1020040093852 A | 11/2004 |

OTHER PUBLICATIONS

International Application No. PCT/US2009/069755, International Search Report and Written Opinion, mail date Apr. 16, 2010.
TW 098146479—First Taiwanese Office Action w/ Translation, mailed Dec. 24, 2012 (13 pages).

* cited by examiner

*Primary Examiner* — Francis M Legasse, Jr.
(74) *Attorney, Agent, or Firm* — Blakely Sokoloff Taylor & Zafman LLP (57) ABSTRACT

A pinned photodiode structure with peninsula-shaped transfer gate which decrease the occurrence of a potential barrier between the photodiode and the floating drain, prevents loss of full well capacity (FWC) and decreases occurrences of image lag.

21 Claims, 8 Drawing Sheets

CMOS PIXEL INCLUDING A TRANSFER GATE OVERLAPPING THE PHOTOSENSITIVE REGION

CROSS-REFERENCE TO RELATED APPLICATIONS

This application claims priority under 35 U.S.C. §119(e) to U.S. Provisional Patent Application No. 61/143,721, filed 9 Jan. 2009 and still pending.

TECHNICAL FIELD

Embodiments of the present invention relate generally to complementary metal oxide semiconductor (CMOS) pixels and in particular, but not exclusively, to a CMOS pixel with a peninsula-shaped transfer gate.

BACKGROUND

CMOS image sensors can use arrays of 4-transistor ("4T") pixels. A 4T pixel generally includes a photodiode (i.e., a photo-sensitive element responsible for collecting electromagnetic energy and converting the collected electromagnetic energy into electrons), a transfer transistor, a source follower amplifier transistor, and a row select transistor. Electrons accumulated in the photosensitive region of the photodiode are ultimately converted into a signal voltage by the transistor components of the pixel cell. One type of photodiode common in CMOS image sensors is a pinned photodiode. In particular, a p-n-p pinned photodiode is typically constructed using a p-type semiconductor substrate, an n-type well implanted into the p-type substrate, and a p+ layer implanted into the n-type well. This p+ layer acts as the "pin" in a p-n-p photodiode.

The efficiency with which the photosensitive region of a photodiode converts incident electromagnetic energy into accumulated electrons depends on many factors, including the full well capacity (FWC) of the photodiode. FWC is a measure of the number of electrons a photodiode can store before it reaches saturation. When the saturation of a photodiode is reached, excess electrons may overflow to adjacent pixels. Increased photodiode FWC may result in a higher dynamic range and higher signal-to-noise ratio for a CMOS sensor, which ultimately results in higher-quality digital images.

Recently, CMOS image sensors have been designed for backside illumination ("BSI"). BSI refers to the illumination of the photo-sensitive region of the photodiode on the surface of the exposed semiconductor substrate (i.e., the backside) or, in the case where an additional p+ implant layer is disposed on a silicon p-type substrate, on the side of the p+ implant. In BSI image sensors, illumination occurs without interference from any metal or oxide layers that form, for example, the transistor components of the pixel cell and associated interconnects, allowing incident electromagnetic energy a more direct path through the photodiode. In a front-side illumination ("FSI") CMOS image sensor, the photo-sensitive region of the photodiode is formed on the side of the substrate closest to the polysilicon, oxide and metal layers such that care must be taken to ensure that the photo-sensitive region of an FSI pixel cell is not covered by polysilicon or metal layers. Therefore, more electromagnetic energy can reach the photodiode in a BSI configuration so as to improve image quality.

As pixel cell size decreases, so does the size of photodiode implants and therefore the size of the photodiode. Smaller photodiode implants may result in a decrease in FWC. A simple way to compensate for the decrease in FWC due to a decrease in photodiode size is to increase the doping concentration in the n-well of the p-n-p photodiode, although one trade-off of increasing n-doping concentration may be an increase in image lag.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. Figures are not drawn to scale unless otherwise indicated.

DETAILED DESCRIPTION OF THE ILLUSTRATED EMBODIMENTS

Embodiments of an apparatus, system and method for a CMOS pixel including a peninsula-shaped transfer gate are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

As pixel cell size decreases, the transistor dimensions also decrease, which decreases the potential under the transfer gate due to the shrinking distance between the transfer gate and the shallow trench isolation (STI) structure edge. The embodiments of a BSI pixel cell disclosed herein utilize a peninsula-shaped transfer gate to prevent loss of full well capacity (FWC) due to encroachment of isolation p region, which creates a barrier that causes less efficient lag transfer.

Figure 1:
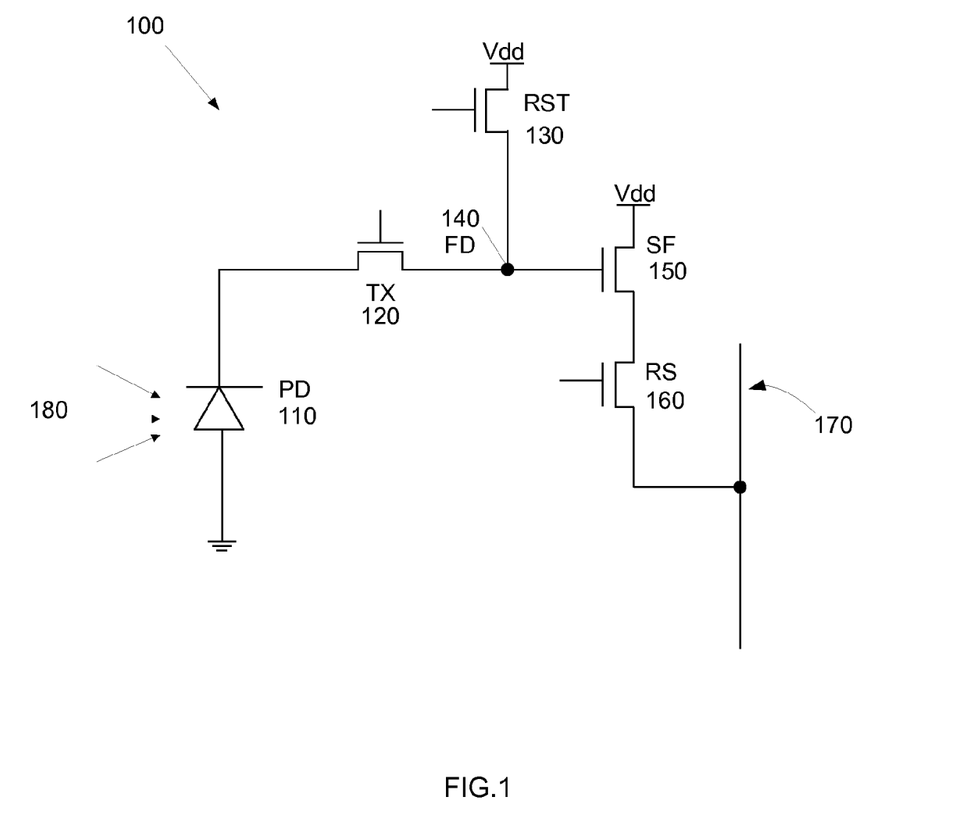
FIG. 1 shows a circuit diagram of an embodiment of a 4T unit pixel cell of an image sensor.

FIG. 1 is a circuit diagram of an embodiment of a 4T unit pixel cell 100 of an imaging sensor. Unit pixel cell 100 includes a photodiode ("PD") 110, a transfer transistor ("TX") 120, a reset transistor ("RST") 130, a source-follower amplifier ("SF") 150 and a row select transistor (RS) 160. Each of TX 120, RST 130, SF 150 and RS 160 includes a source, a drain and a gate. PD 110 is electrically connected to the source of TX 120. The drain of TX 120 is coupled to the drain of RST 130 at a floating drain ("FD") 140 and to the gate of SF 150. The drain of SF 150 is connected to the source of RS 160. The drain of RS 160 is connected to a column bus 170. The source of RST 130 and the source of SF 150 are connected to potential Vdd.

When TX 120 is turned off, RST 130 is turned on by a reset pulse, and FD 140 is subsequently set to a voltage level of approximately Vdd. The voltage at FD 140 is in turn amplified by SF 150, when a row select signal is applied to the gate of RS 160. Subsequently, the reset voltage level of Vdd is transferred to column bus 170.

During exposure of pixel cell 100 to electromagnetic energy (represented by arrows 180), such as when an image is being taken on a camera and a shutter of the camera is open, PD 110 produces and accumulates electrons. This exposure period is also known as an integration period. At the end of the integration period, a transfer pulse signal is applied to the gate of TX 120 to turn on TX 120, thereby allowing accumulated electrons (i.e., charge) in PD 110 to transfer to FD 140. SF 150 converts this charge at FD 140 to a signal voltage. When a row select signal is applied to the gate of RS 160, an accumulated voltage level at RS 160 is transferred to column bus 170. The voltage on column bus 170 is sampled at both the accumulated voltage level as well as the reset voltage level, such that a difference between the accumulated and reset voltage levels is the signal voltage due to the incidence of electromagnetic energy 180 on photodiode 110.

Before another image can be taken during a second integration period, the photodiode itself is reset. This reset occurs by applying a transfer signal to the gate of TX 120 while simultaneously applying a reset signal to the gate of RST 130. PD 110 is thus reset to approximately Vdd and the pixel cell is ready for a second integration period.

Any accumulated charge in PD 110 that was not transferred from PD 110 to FD 140 via TX 120 may remain in PD 110 after reset, and may contribute to image lag (i.e., due to the carry-over of remaining charge to subsequent integration periods, and thus subsequent images). In addition to causing image lag, electrons remaining in PD 100 after reset may effectively reduce the full well capacity (FWC) of the photodiode for subsequent integration periods.

Figure 2A:
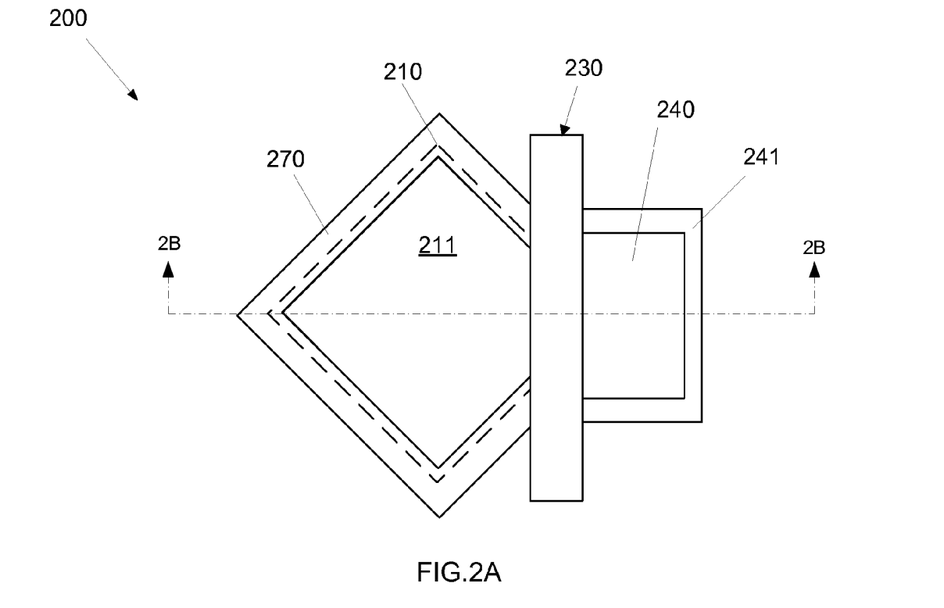
FIG. 2A shows a top (i.e., front side) view of a portion of a BSI pixel structure.
Figure 2B:
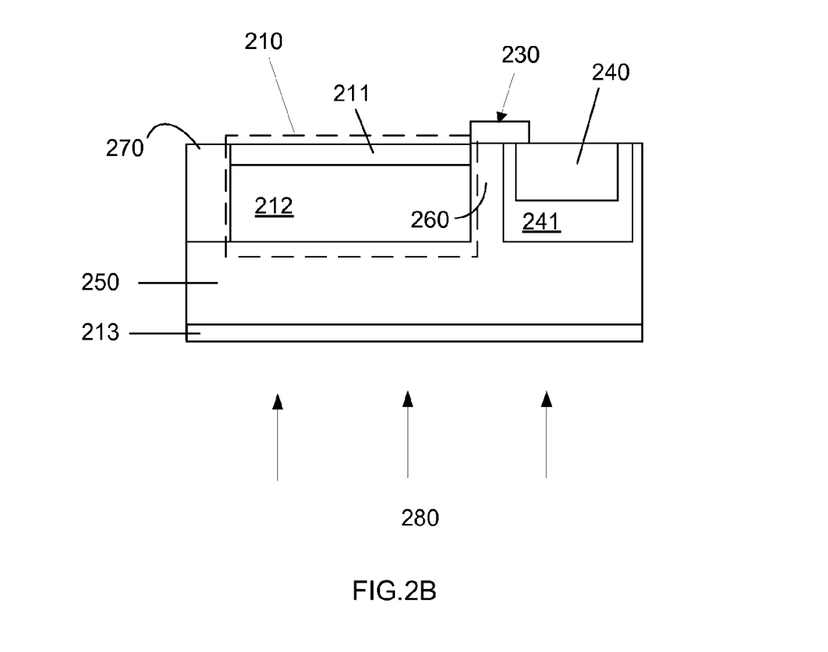
FIG. 2B shows the cross section of a portion of the BSI pixel structure of FIG. 2A.

Turning now to FIGS. 2A and 2B, a portion of an embodiment of a backside illumination (BSI) pixel structure is illustrated. FIG. 2A shows a top view of a portion of BSI pixel structure 200. The view shown in FIG. 2A corresponds to what is commonly referred to as the front side. FIG. 2B shows a cross sectional view of BSI pixel structure 200. For simplicity, only elements directly associated with certain parts of the transfer gate and photodiode of the BSI pixel structure are shown in FIGS. 2A and 2B. As is visible from the top view shown in FIG. 2A, BSI pixel structure 200 includes photodiode 210, a transfer gate 230, a floating drain 240 disposed within a p-type floating drain well 241, and a shallow trench isolation (STI) structure 270.

As may be seen in FIG. 2B, the portion of BSI pixel structure 200 further includes a p-doped substrate 250 and an n-type photodiode implant 212 formed within the front-side of p-doped substrate 250. Completing the p-n-p structure, p+ pinned photodiode implant layer 211 is disposed on top of an n-type photodiode implant layer 212. Furthermore, a p+ photodiode implant layer 213 on the back-side surface of p-type substrate 250 serves as a contact to p-type substrate 250.

During a given photodiode integration time, electromagnetic energy 280 is incident upon BSI pixel structure 200 through p+ photodiode implant layer 213 on the backside of silicon substrate 250. STI 270 surrounds and electrically isolates the photodiode 210 from adjacent photodiodes (not shown). As previously mentioned, after the integration period, a transfer pulse signal is applied to transfer gate 230, which separates photodiode 210 from floating drain 240 and p-type floating drain well 241. Accumulated charge then travels along a channel region 260 of substrate 250 from photodiode 210 to floating drain 240. P-type floating drain well 241 isolates p-type substrate 250 from n-type floating drain 240, which has relatively higher doping in comparison to p-type substrate 250.

Figure 3A:
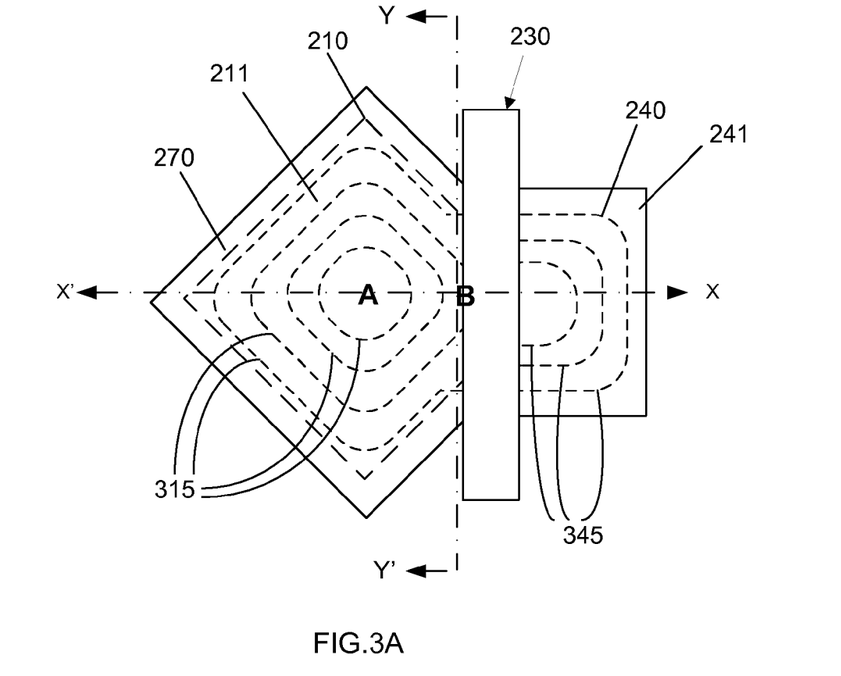
FIG. 3A illustrates equipotential lines across the portion of the BSI pixel structure shown in FIG. 2A.
Figure 3B:
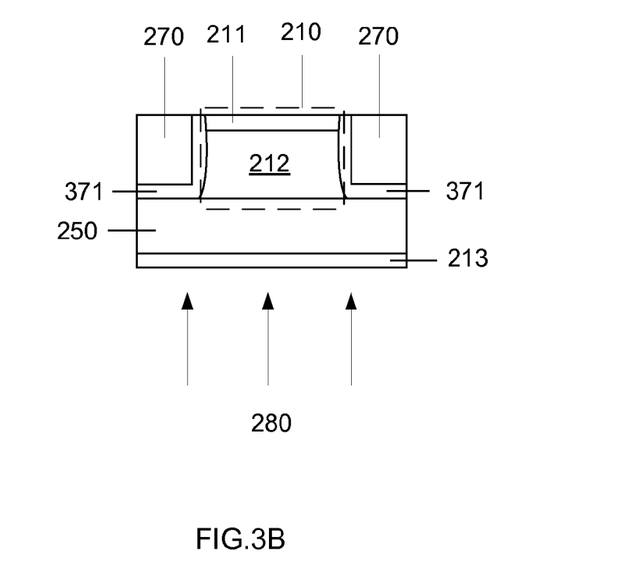
FIG. 3B shows the cross section of a portion of the BSI pixel structure of FIG. 3A, taken substantially along section line Y-Y' in FIG. 3A.

FIG. 3A illustrates equipotential lines 315 and 345 across the portion of BSI structure 200 of FIG. 2A. That is, each of equipotential lines 315 and 345 represent an electrical potential value that is substantially the same along a line, but may vary for different lines. FIG. 3B illustrates the cross section of the photodiode and transfer gate taken along line Y-Y' in FIG. 3A at the edge of photodiode 210 closest to transfer gate 230. This cross-section further shows p+ photodiode implant layer 213 disposed on and in electrical connection with the surface of p-doped substrate 250 and p+ photodiode implant layer 213 that is exposed to electromagnetic energy 280 during operation of the unit pixel cell. Further disposed on and in electrical contact with p-doped substrate 250 are p-type channel stop 371, and n-type photodiode implant 212, as shown in FIG. 3B. Channel stop 371 surrounds and substantially electrically, isolates STI 270 from n-type photodiode implant 212.

The maximum electrical potential of photodiode 210 is generally present in a central area, which is denoted "A." Ideally, the potential of the photodiode would be equal at all points across photodiode 210, but that is not the case in most circumstances. For example, the surface of STI 270 can have defects that result from the pixel cell formation process. These defects may cause dark current, the effects of which may be mitigated by utilizing a p-type channel stop 371 to isolate STI structure 270 from photodiode 210. N-type photodiode implant 212 may react with p-type channel stop 371 and form a depletion region, thus decreasing the potential of photodiode 210 in the area closest to STI 270.

Referring again to FIG. 3A, an area denoted by B represents an area of lower potential in photodiode 210 under transfer gate 230 when transfer gate 230 is turned on. Area B may experience a lower potential than area A because of the short distance between the edge of photodiode 210 and p-type channel shop 371, which isolates STI 270. Potential difference between areas A and B may prevent accumulated electrons in photodiode 210 from being transferred to floating drain 240 via transfer gate 230 such that a potential barrier between photodiode 210 and floating drain 240 may result.

Figure 3C:
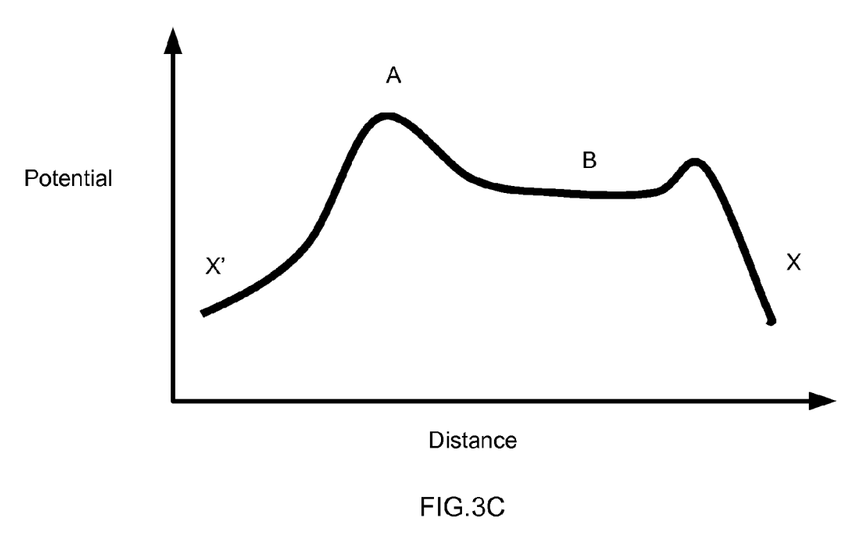
FIG. 3C is a graphical representation of potential found along a line X-X' in FIG. 3A.

FIG. 3C shows a graphical representation of the potential found along a line X-X' in FIG. 3A. As can be seen in FIG. 3C, area B shows a dip in potential, which acts as a potential barrier. This potential barrier, when present, may prevent complete electron transfer from photodiode 310 to floating drain 240 when a transfer pulse signal is applied to transfer gate 230, resulting in electrons at the photodiode that remain after reset. As discussed above, this remaining accumulated charge may interfere with subsequent integration periods and/or reduce the FWC of the photodiode as a whole. P-type channel stop 371 has a similar effect on floating drain 240, as illustrated by equipotential lines.

Figure 4A:
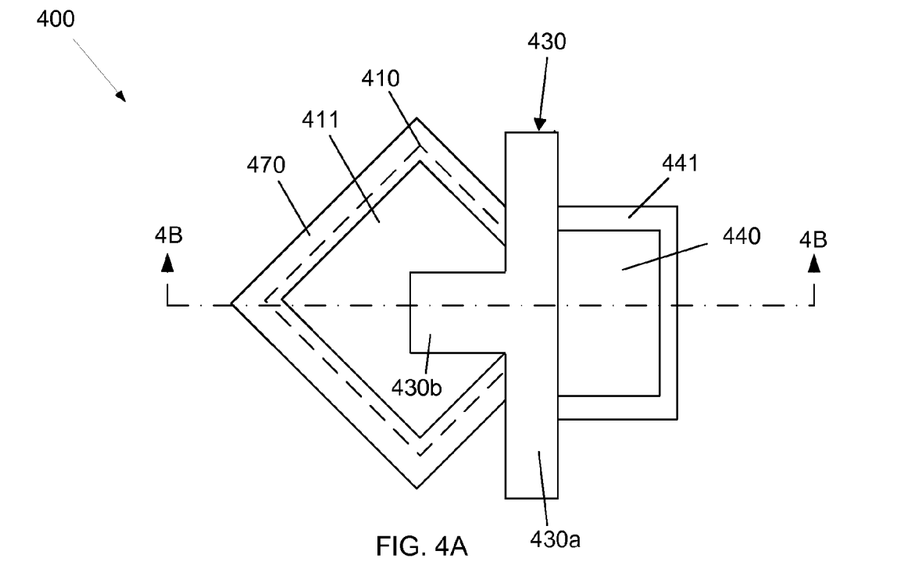
FIG. 4A is a top view of an embodiment of a portion of a BSI pixel cell utilizing a peninsula-shaped transfer gate.
Figure 4B:
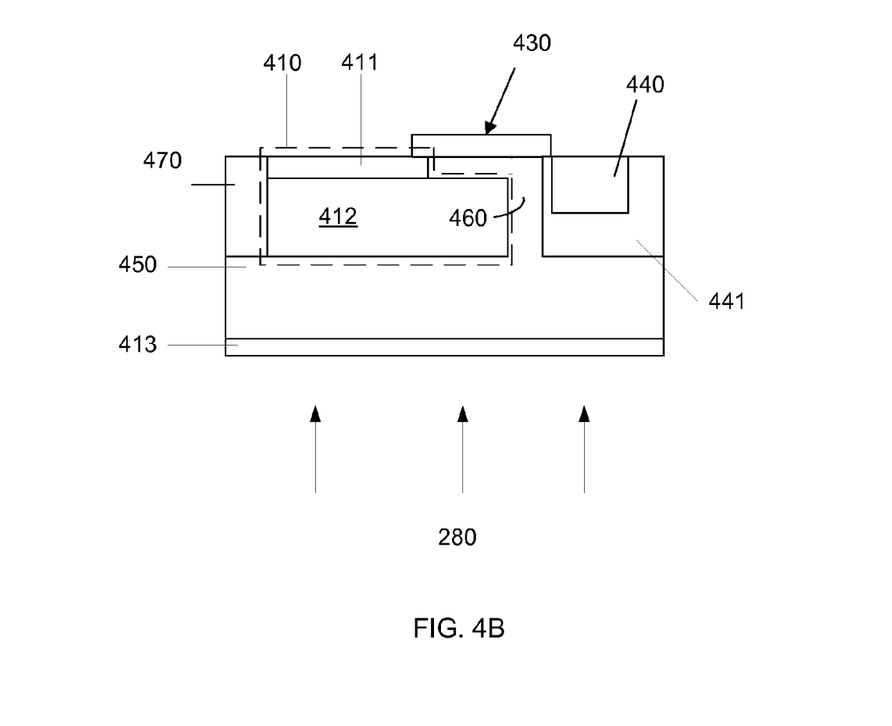
FIG. 4B is a cross sectional view of the portion of the BSI pixel cell of FIG. 4A.

FIG. 4A illustrates a planar top view of one embodiment of part of a BSI pixel cell 400 having a peninsula-shaped transfer gate 430. As used herein, the term "peninsula-shaped transfer gate" refers to a transfer gate in which a portion of the gate substantially extends beyond, or outward from, the BSI transfer gate 230 (as seen in FIG. 2A) towards the center of photodiode 410 such that the extended portion of transfer gate 430 lies along the line 4B-4B as seen in FIG. 4A. The line 4B-4B is used in FIG. 4A to denote the area of the cross sectional view seen in FIG. 4B which intersects the centre of photodiode 410 across and is perpendicular to transfer gate 430. BSI pixel cell 400 includes an STI 470 and a channel 460.

In contrast to the transfer gates typically used in pixels (see FIG. 2), transfer gate 430 utilized in BSI pixel cell 400 includes main portion 430a that substantially corresponds to BSI transfer gate 230 (see FIG. 2A) and a "peninsula" or protrusion 430b that projects or extends from main portion 430a on the same plane over at least a portion of photodiode 410. In the example presented in FIGS. 4A-4B, this peninsula is a perpendicular protrusion causing transfer gate 230 to form a "T" shape that overlies the photosensitive area of photodiode 410, resulting in a smaller p+pinned photodiode implant area 411 as compared to a similarly-sized p-n-p pixel structure. While the peninsula is shown to be perpendicular to, and in the same plane as, the transfer gate in FIG. 5A, it is noted that other configurations, such as a slanted protrusion, or a wider strip, may be effective in certain applications. In one embodiment, N-type photodiode implant 412 remains unchanged from the photodiode presented in FIG. 2A and 2B. Because of the BSI architecture of pixel unit cell 400, the surface areas of substrate 450, p+photodiode implant 413, p-type substrate 450, and n-type photodiode implant 412 are not affected by the use of peninsula-shaped transfer gate 430. The structure of floating drain 440, and p-type floating drain well 441 are also not affected by the peninsula gate.

Figure 5A:
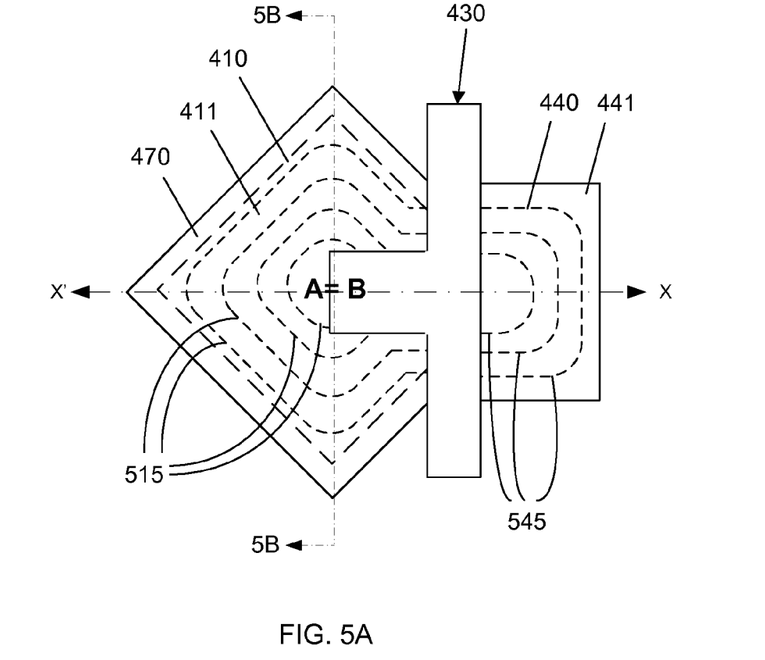
FIG. 5A shows the equipotential lines across the portion of the BSI pixel cell of FIG. 4A.

FIG. 5A illustrates equipotential lines 515 and 545 for the portion of pixel unit cell 400 depicted in FIG. 4A. Note that the shape of equipotential lines 515 in photodiode 410 are similar to equipotential lines 315 in FIG. 3A. As in FIG. 3A, the maximum (electrical) potential of photodiode 410 is near the innermost area of photodiode 410 as denoted by A. Importantly, though, this maximum potential at area A is also located at the intersection of photodiode 410 with transfer gate 430 (B) and between transfer gate 430 and floating drain 440. As illustrated in FIGS. 5A and 5C, the use of a peninsula-shaped transfer gate results in a decrease in the potential barrier between points A and B as compared to the potential barrier found between A and B in FIGS. 3A and 3C. This decrease in potential barrier is represented graphically in FIG. 5C as potential vs. distance along line X-X' (shown in FIG. 5A). Referring again to FIG. 5A, the peak potential of the photodiode, denoted by A, is the same as the potential under transfer gate 430, denoted by B. A lower potential barrier across photodiode 410 could result in more accumulated charge being transferred from photodiode 410 to floating drain 440 when transfer gate 430 is turned on. This means that fewer electrons from a previous integration period may remain in subsequent integration periods, thereby preventing loss of FWC and decreasing image lag.

Figure 5B:
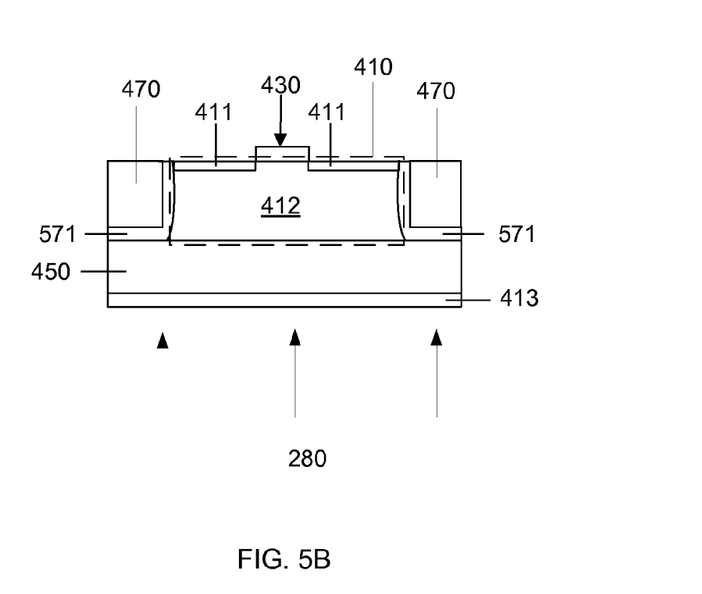
FIG. 5B shows a cross section of the portion of the BSI pixel cell of FIG. 5A, taken substantially along section line 5B-5B in FIG. 5A.
Figure 5C:
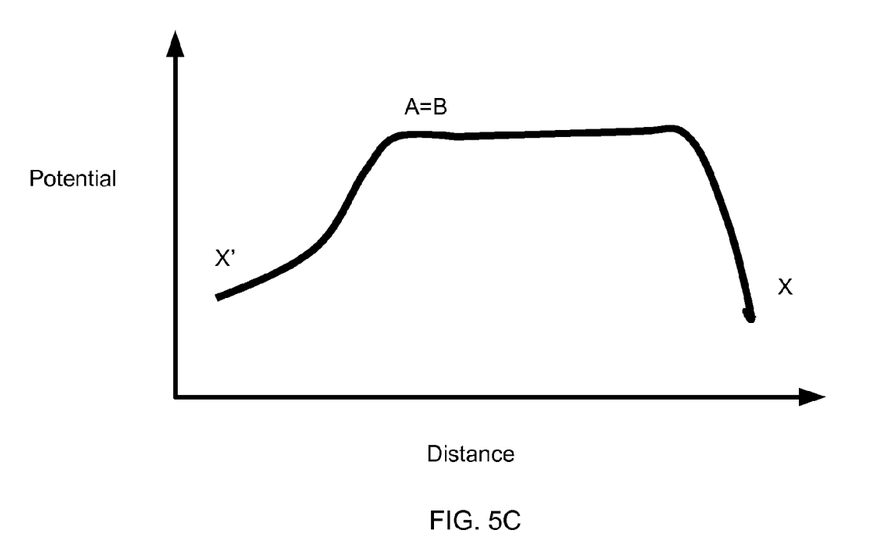
FIG. 5C is a graphical representation of potential found across a line X-X' in FIG. 5A.

FIG. 5B illustrates the cross section of unit pixel cell 400 across line 5B-5B in FIG. 5A, through peninsula-shaped transfer gate 430, where it overlies with photodiode 410. The area denoted by B in FIG. 5A is seen in this cross section. P-type channel stop 571 and photodiode 410—comprised of p+ pinned and n-type photodiode implant 411 and 412 respectively, p-doped substrate 450 and p+ photodiode implant 413—are separated by a greater distance compared to BSI p-type channel stop 371 and photodiode 210—comprised of p+ pinned and n photodiode implant 311 and 312 respectively, p-doped substrate 340 and p+ photodiode implant 313—in FIG. 3C. In this way, the peninsula-shaped gate may also lessen the influence of p-type channel stop encroachment on the n-type photodiode implantation. This may result in a photodiode with greater full well capacity when compared to a photodiode from a BSI pixel cell.

As demonstrated throughout this disclosure, a peninsula-shaped transfer gate may lower the potential barrier across a BSI pixel cell between the photodiode and the floating drain. This may result in a decrease in image lag compared to other BSI pixel cell structures. In addition, encroachment of the p-type channel stop—which isolates the STI from the photodiode—on the photodiode may result in a potential difference across different areas of the photodiode in a BSI pixel unit cell. A potential difference across different areas of a photodiode may prevent accumulated electrons in a photodiode from being transferred to a floating point via a transfer gate; these electrons may cause an image lag in subsequent integration periods. The use of a peninsula-shaped transfer gate as disclosed herein reduces the influence of the p-type channel stop on the area of the photodiode under the transfer gate by increasing the physical distance between the transfer gate and the STI. This may result in a decrease in occurrence or magnitude of a potential barrier between the photodiode and the floating drain, prevent loss of FWC of the photodiode area and decrease occurrence of image lag when compared to some BSI pixel cells.

Although the specific photodiode examples described throughout this disclosure are p-n-p type photodiodes, the use of a peninsula-shaped transfer gate is also broadly applicable to other photodiode types such as n-p-n photodiodes. Although the example of a peninsula-shaped transfer gate described herein is utilized in a BSI pixel cell architecture, it may also be utilized with other architectures such as an FSI pixel cell. In addition, peninsula shapes other than those forming a "T" will result in similar reduction of potential barrier between the photodiode and the floating drain, and fall within the scope of this disclosure. Further, the photodiode described herein could be placed in any orientation with respect to the peninsula-shaped transfer gate.

Figure 6:
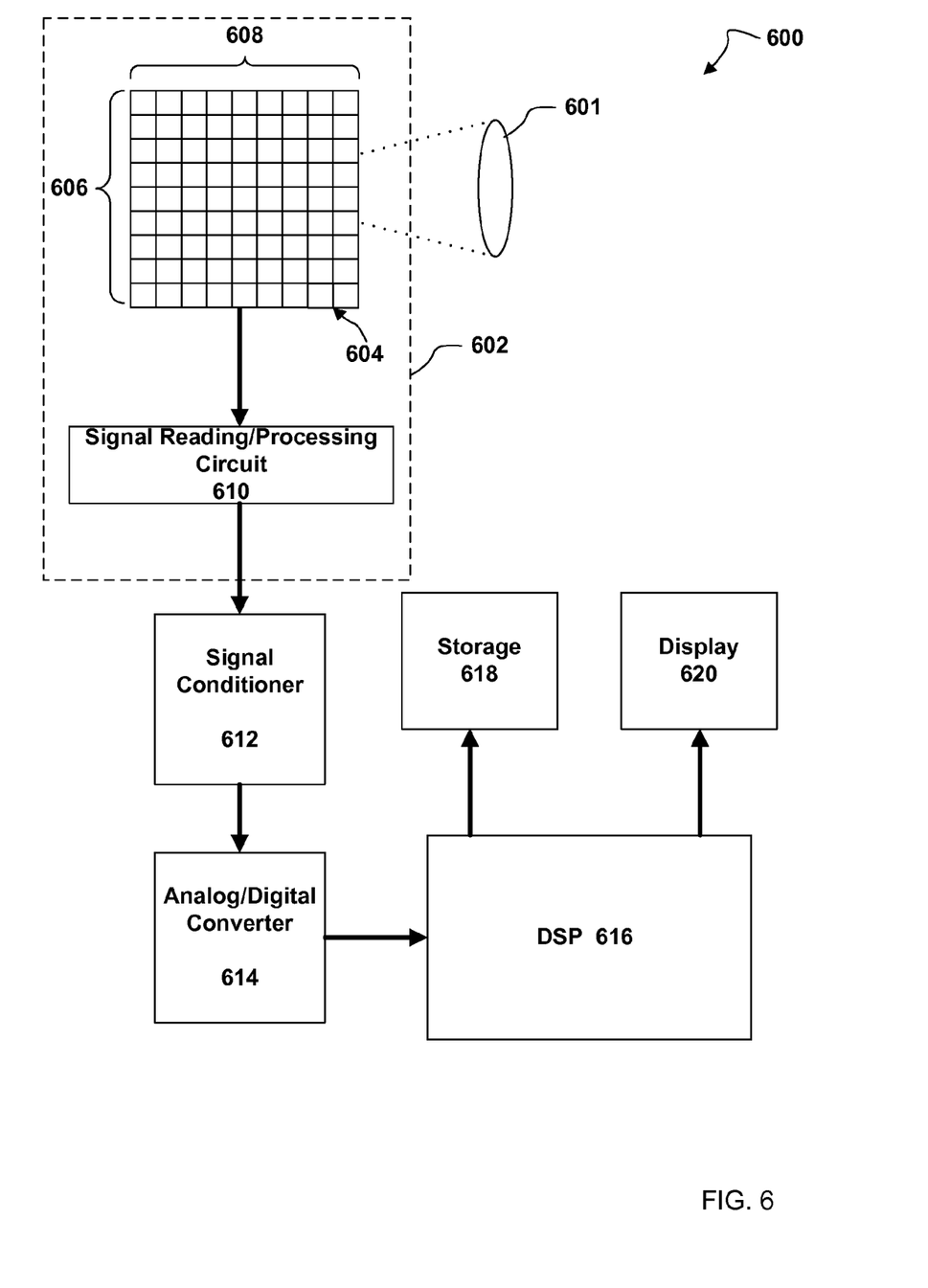
FIG. 6 is a block diagram of an embodiment of an imaging system that can use one of the disclosed pixel embodiments.

FIG. 6 illustrates an embodiment of an imaging system 600. Optics 601, which can include refractive, diffractive or reflective optics or combinations of these, are coupled to image sensor 602 to focus an image onto the pixels in pixel array 604 of the image sensor. Pixel array 604 captures the image and the remainder of imaging system 600 processes the pixel data from the image.

Image sensor 602 comprises a pixel array 604 and a signal reading and processing circuit 610. In one embodiment, image sensor 602 is a backside illuminated (BSI) image sensor including a pixel array 604 that is two-dimensional and includes a plurality of pixels arranged in rows 606 and columns 608, but in other embodiments it could be a front side illuminated (FSI) image sensor or an image sensor that combines BSI with FSI. In one embodiment, one or more of the pixels in pixel array 604 can be one of the pixel embodiments shown in FIGS. 4A-4B or 5A-5B, but in other embodiments of pixel array 604 one or more of the pixels can be any of the variations discussed herein.

During operation of pixel array 604 to capture an image, each pixel in pixel array 604 captures incident light (i.e., photons) during a certain exposure period and converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

Illustrated pixel array 604 is regularly shaped, but in other embodiments the array can have a regular or irregular arrangement different than shown and can include more or less pixels, rows, and columns than shown. Moreover, in different embodiments pixel array 604 can be a color image sensor including red, green, and blue pixels designed to capture images in the visible portion of the spectrum, or can be a black-and-white image sensor and/or an image sensor designed to capture images in the invisible portion of the spectrum, such as infra-red or ultraviolet.

Image sensor 602 includes signal reading and processing circuit 610. Among other things, circuit 610 can include circuitry and logic that methodically reads analog signals from each pixel, filters these signals, corrects for defective pixels, and so forth. In an embodiment where circuit 610 performs only some reading and processing functions, the remainder of the functions can be performed by one or more other components such as signal conditioner 612 or digital signal processor (DSP) 616. Although shown in the drawing as an element separate from pixel array 604, in some embodiments reading and processing circuit 610 can be integrated with pixel array 604 on the same substrate or can comprise circuitry and logic embedded within the pixel array. In other embodiments, however, reading and processing circuit 610 can be an element external to pixel array 604 as shown in the drawing. In still other embodiments, reading and processing circuit 610 can be an element not only external to pixel array 604, but also external to image sensor 602.

Signal conditioner 612 is coupled to image sensor 602 to receive and condition analog signals from pixel array 604 and reading and processing circuit 610. In different embodiments, signal conditioner 612 can include various components for conditioning analog signals. Examples of components that can be found in the signal conditioner include filters, amplifiers, offset circuits, automatic gain control, etc. In an embodiment where signal conditioner 612 includes only some of these elements and performs only some conditioning functions, the remaining functions can be performed by one or more other components such as circuit 610 or DSP 616. Analog-to-digital converter (ADC) 614 is coupled to signal conditioner 612 to receive conditioned analog signals corresponding to each pixel in pixel array 604 from signal conditioner 612 and convert these analog signals into digital values.

DSP 616 is coupled to analog-to-digital converter 614 to receive digitized pixel data from ADC 614 and process the digital data to produce a final digital image. DSP 616 can include a processor and an internal memory in which it can store and retrieve data. After the image is processed by DSP 616, it can be output to one or both of a storage unit 618 such as a flash memory or an optical or magnetic storage unit and a display unit 620 such as an LCD screen.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
   a photodiode formed in a substrate, the photodiode including a photosensitive area;
   a floating drain formed in the substrate; and
   a transfer gate positioned on a surface of the substrate between the photodiode and the floating drain, the transfer gate including a protrusion that extends from an edge of the photosensitive area to a part of the photosensitive area having maximum electrical potential, wherein the transfer gate protrusion is on the same plane as the transfer gate.

2. The apparatus of claim 1 wherein the diode is a pinned photodiode.

3. The apparatus of claim 2 wherein the pinned photodiode includes an n-type photodiode and a p+ pinning layer.

4. The apparatus of claim 1 wherein the protrusion projects substantially perpendicular to a main portion of the transfer gate, such that the transfer gate is substantially T-shaped.

5. The apparatus of claim 1 wherein the protrusion is quadrilateral.

6. The apparatus of claim 1, further comprising a floating drain well adjacent to the floating drain.

7. The apparatus of claim 1, further comprising an implant layer formed on a side of the substrate opposite the side of the substrate on which the photodiode is formed.

8. The apparatus of claim 7 wherein the substrate is p-doped, the photodiode is n-doped and the implant layer is a p+ implant layer.

9. A process comprising:
   forming a photosensitive area of a photodiode in a substrate;
   forming a floating drain in the substrate;
   forming a transfer gate on a surface of the substrate between the photodiode and the floating drain, the transfer gate including a protrusion that extends from an edge of the photosensitive area to a part of the photosensitive area having maximum electrical potential.

10. The process of claim 9, further comprising forming a pinned region of the photodiode.

11. The process of claim 10 wherein the pinned photodiode includes an n-type photodiode and a p+ pinning layer.

12. The process of claim 9 wherein the protrusion projects substantially perpendicular to a main portion of the transfer gate, such that the transfer gate is substantially T-shaped.

13. The process of claim 9 wherein the protrusion is quadrilateral.

14. The process of claim 9, further comprising forming a floating drain well adjacent to the floating drain.

15. The process of claim 9, further comprising forming an implant layer on a side of the substrate opposite the side of the substrate on which the photodiode is formed.

16. The process of claim 15 wherein the substrate is p-doped, the photodiode is n-doped and the implant layer is a p+ implant layer.

17. A system comprising:
a CMOS image sensor formed in a substrate, wherein the CMOS image sensor has a pixel array including one or more CMOS pixels comprising:
- a photodiode formed in the substrate, the photodiode including a photosensitive area;
- a floating drain formed in the substrate; and
- a transfer gate positioned on a surface of the substrate between the photodiode and the floating drain, the transfer gate including a protrusion that extends from an edge of the photosensitive area to a part of the photosensitive area having maximum electrical potential; and
- processing circuitry coupled to the pixel array to process a signal received from the pixel array.

18. The system of claim 17 wherein the protrusion projects substantially perpendicular to a main portion of the transfer gate, such that the transfer gate is substantially T-shaped.

19. The system of claim 17, further comprising at least one of a signal conditioning circuit, an analog/digital converter and a digital signal processor coupled to the processing circuitry.

20. The system of claim 19, further comprising a storage unit, a display unit, or both, coupled to the digital signal processor.

21. The system of claim 17, further comprising at least one optical element coupled to the CMOS image sensor.

* * * * *